US009869703B2

(12) United States Patent
Chen et al.

(10) Patent No.: US 9,869,703 B2
(45) Date of Patent: Jan. 16, 2018

(54) ENERGY MONITORING CURRENT TRANSFORMER ENCLOSURE

(71) Applicants: Liang Light Chen, Los Gatos, CA (US); David Whitney, Saratoga, CA (US)

(72) Inventors: Liang Light Chen, Los Gatos, CA (US); David Whitney, Saratoga, CA (US)

(73) Assignee: CyberSwitchingPatents, LLC, San Jose, CA (US)

( * ) Notice: Subject to any disclaimer, the term of this patent is extended or adjusted under 35 U.S.C. 154(b) by 115 days.

(21) Appl. No.: 14/827,306

(22) Filed: Aug. 15, 2015

(65) Prior Publication Data

US 2017/0045556 A1   Feb. 16, 2017

(51) Int. Cl.
  *G01R 15/18*   (2006.01)
  *G01R 19/25*   (2006.01)
  *H01F 27/02*   (2006.01)
  *H01F 27/04*   (2006.01)

(52) U.S. Cl.
  CPC ......... *G01R 19/2513* (2013.01); *H01F 27/02* (2013.01); *H01F 27/04* (2013.01)

(58) Field of Classification Search
  CPC ............ G01R 1/20; G01R 1/22; G01R 15/20; G01R 21/08; G01R 33/075; G01R 11/06; G01R 19/20; G01R 33/0283; G05G 2009/04755; G06G 7/162
  See application file for complete search history.

(56) References Cited

U.S. PATENT DOCUMENTS

| 5,426,360 A * | 6/1995 | Maraio | G01R 15/142 |
| | | | 324/126 |
| 2009/0124119 A1* | 5/2009 | Austin | G01R 11/04 |
| | | | 439/517 |
| 2015/0054610 A1* | 2/2015 | Cook | H01F 38/30 |
| | | | 336/132 |

* cited by examiner

*Primary Examiner* — Tung X Nguyen
(74) *Attorney, Agent, or Firm* — Douglas L. Weller

(57) ABSTRACT

An enclosure for an energy monitoring current transformer includes upper housing that houses an upper transformer core section. Lower housing houses a transformer coil and a lower transformer core section. When the enclosure is assembled there is an overlap between the cap for the lower housing and the lower housing that lengthens a creepage path from the upper transformer core to the external surface of the enclosure.

8 Claims, 12 Drawing Sheets

8.9 Electrical spacings for a controlled environment shall comply with Table 8.2.

Table 8.2
"Controlled environment" spacings

| Primary Voltage (LA) | From external surface to transformer core or other dead-metal part*<br>Over-surfaces and Through-air | From external surface to coil, exposed conductor ends inside case or other live components*<br>Over-surfaces and Through-air |
|---|---|---|
| Non-service entrance | | |
| 0 – 250 | 3.0 mm | 8.0 mm |
| 251 – 600 | 8.0 mm | 12.0 mm |
| Service entrance | | |
| 0 – 250 | 1.5 mm | 10.0 mm |
| 251 – 600 | 8.0 mm | 16.0 mm |

See 8.2 for possible increased spacings requirements to coil.
* For current transformers intended for altitudes above 2000 meters, see 8.10.

FIG. 14 (Prior Art)

ENERGY MONITORING CURRENT TRANSFORMER ENCLOSURE

BACKGROUND

Energy monitoring current transformer are often used as low voltage non-invasive current sensing devices. Underwriters Laboratories (UL) 2808 sets out standards for open-type current transformers rated for use in either 250 volt alternate current (VAC) or 600 VAC line-to-line circuits. The transformers are evaluated for installation within equipment on the load side of the service equipment over current device.

BRIEF DESCRIPTION OF THE DRAWINGS

FIG. 14 shows Table 8.2 of UL 2808 in accordance with the prior art.

DESCRIPTION OF THE EMBODIMENT

Figure 1:
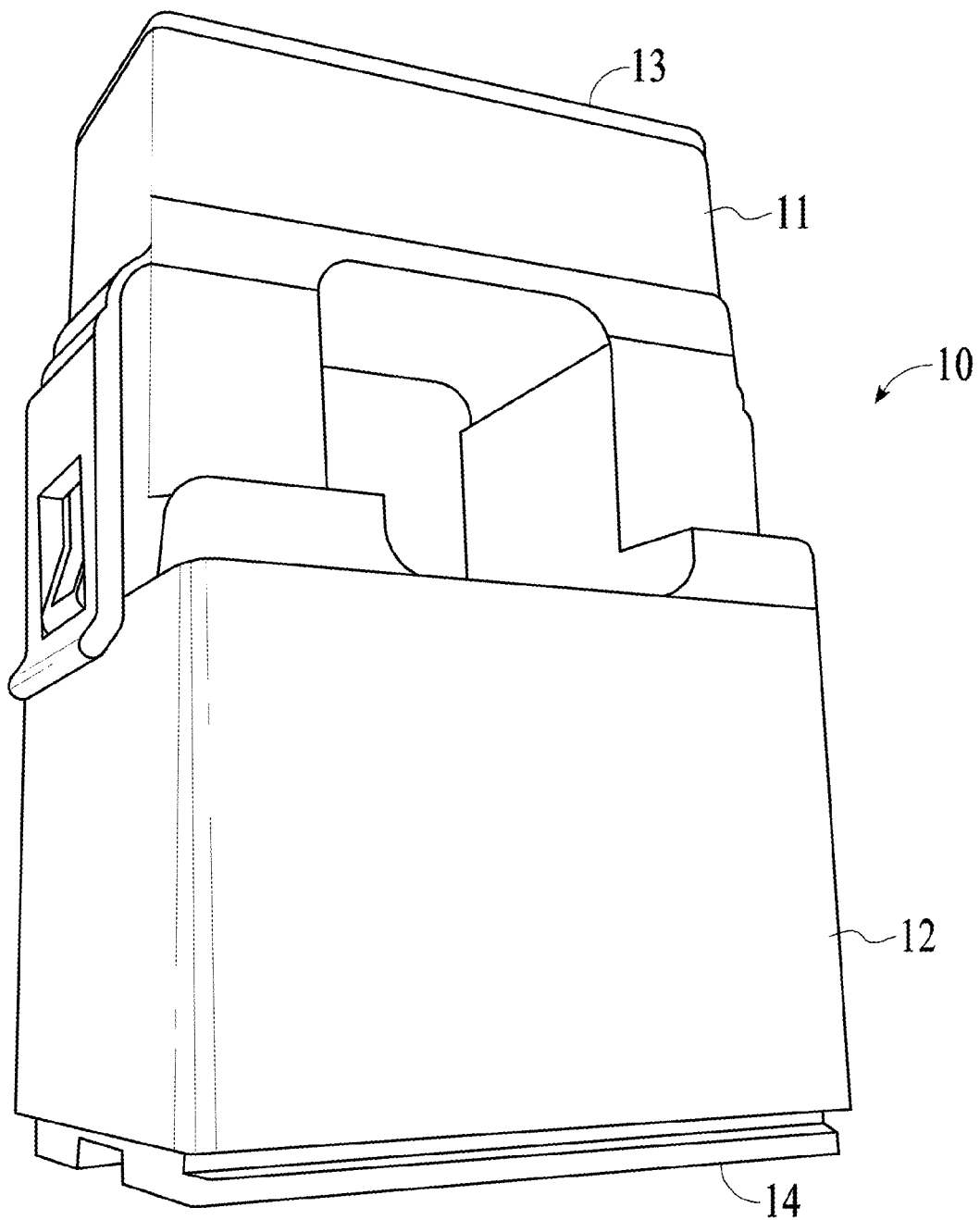
FIG. 1 shows an assembled energy monitoring current transformer in accordance with an implementation.

FIG. 1 shows an assembled energy monitoring current transformer 10. The enclosure for energy monitoring current transformer 10 includes an upper housing 11, a cap 13 for upper housing 11, a lower housing 12, and a lower housing cap 14. For example, the enclosure is composed of plastic.

Figure 2:
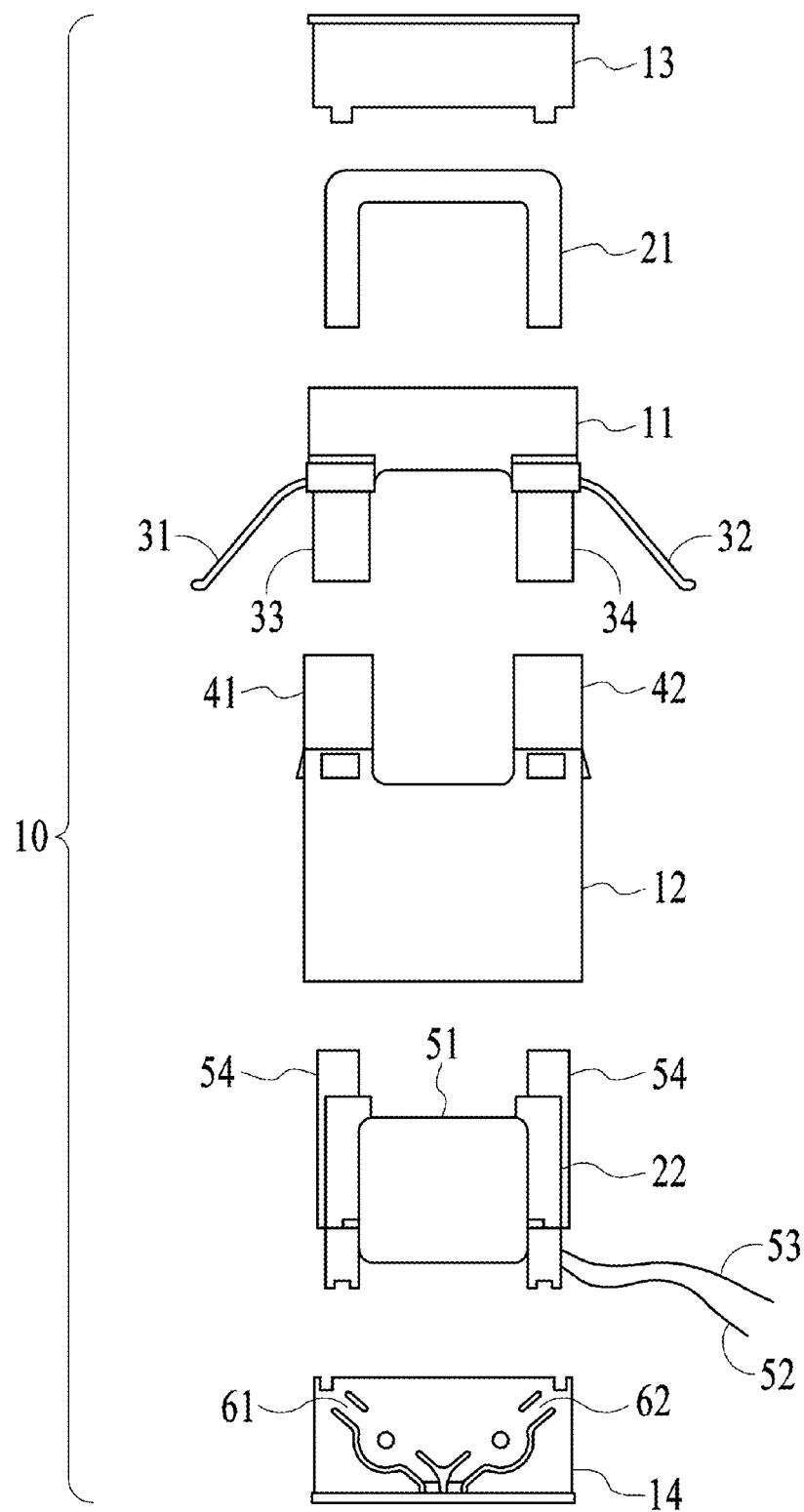
FIG. 2 shows a disassembled energy monitoring current transformer in accordance with an implementation.
Figure 3:
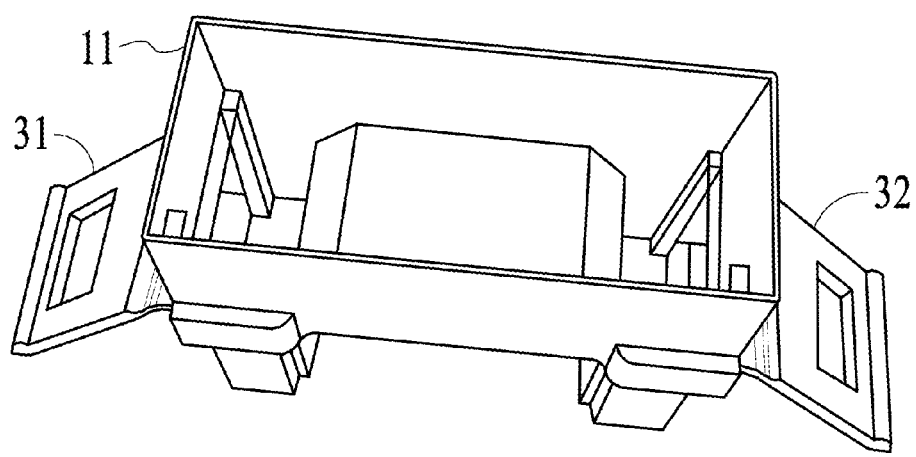
FIG. 3 shows an upper housing portion for a transformer core upper half of an energy monitoring current transformer in accordance with an implementation.
Figure 4:
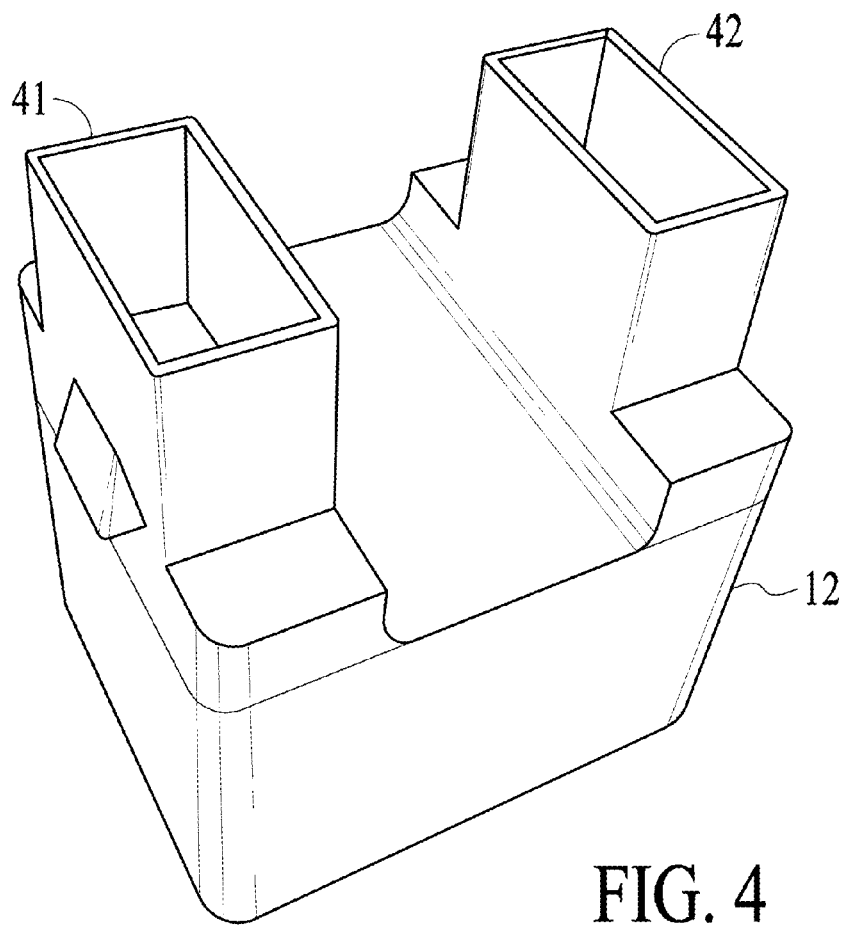
FIG. 4 shows a lower housing portion for a transformer coil and a transformer core lower half of an energy monitoring current transformer in accordance with an implementation.

FIG. 2 shows energy monitoring current transformer 10 disassembled. An upper transformer core section 21 is placed in upper housing 11 and held in case by a cap 13. A leg 33 of upper housing is inserted into a leg 41 of lower housing 12. A leg 34 of upper housing is inserted to a leg 42 of lower housing 12. A tab 31 and a tab 32 holds upper housing 11 securely to lower housing 12. Additional detail of upper housing 11 is shown in FIG. 3. Additional detail of lower housing 12 is shown in FIG. 4.

Figure 5:
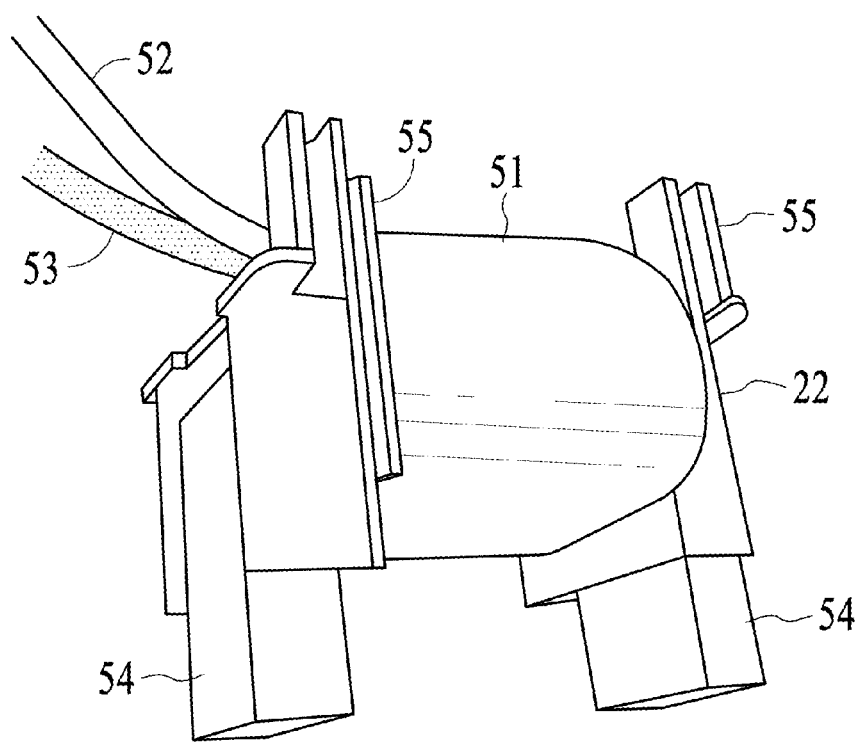
FIG. 5 shows a transformer coil and transformer core lower half of an energy monitoring current transformer in accordance with an implementation.
Figure 6:
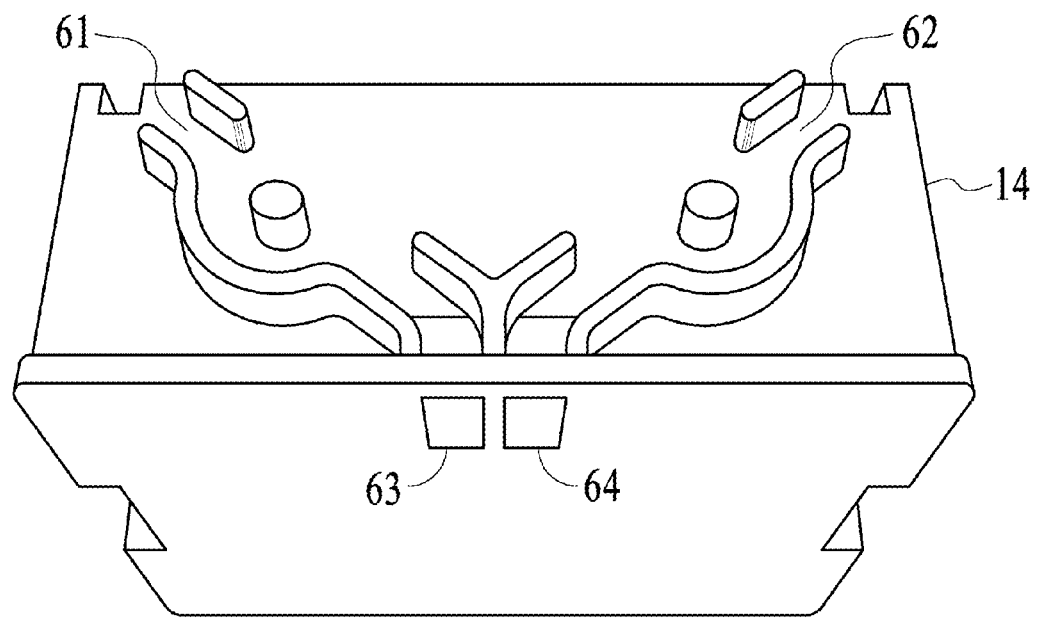
FIG. 6 and FIG. 7 show a cap for the lower housing portion shown in FIG. 4, the cap having channels for guiding lead wires in accordance with an implementation.
Figure 7:
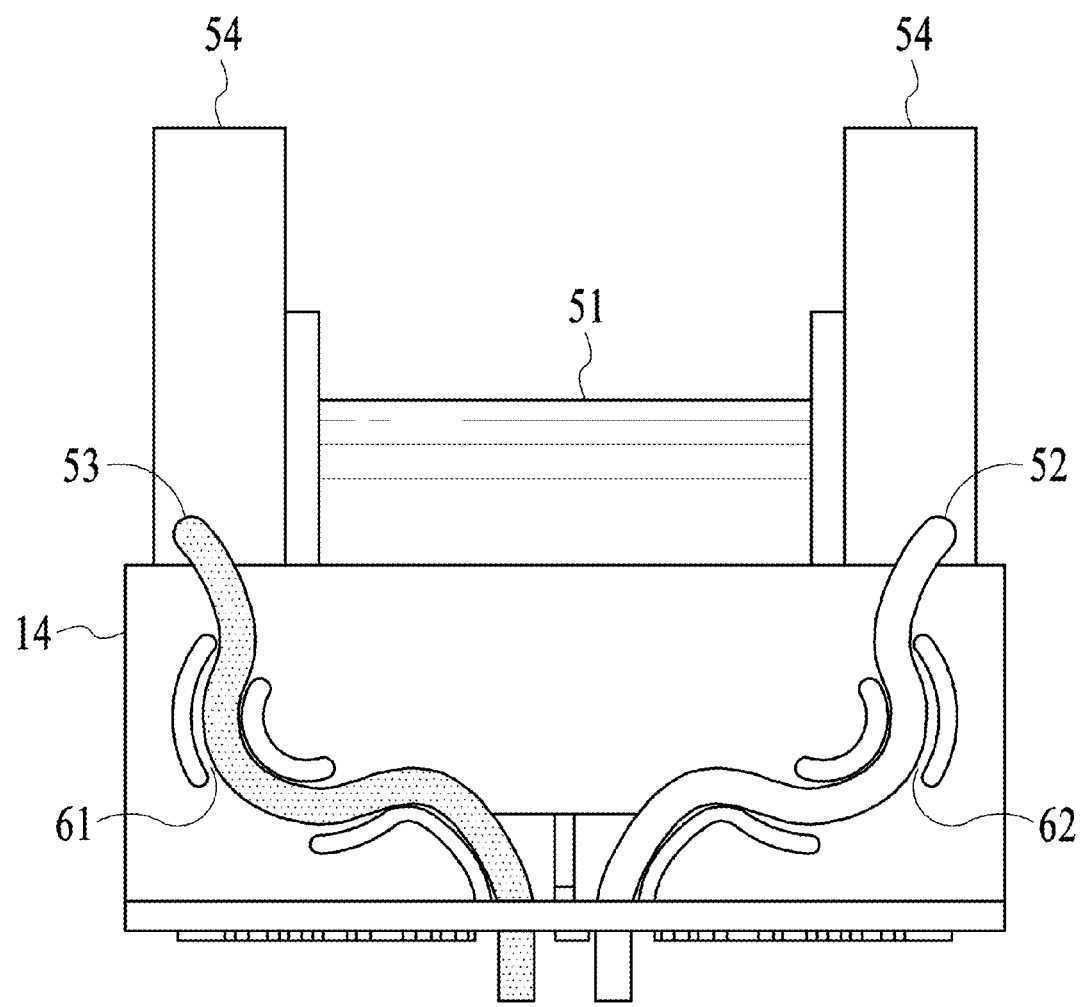

A transformer part 22 shown in FIG. 2 and FIG. 5 includes a transformer coil 51, a lower transformer core section 54 and a plastic frame 55. A wire end of 52 and a wire end 53 of transformer coil 51 are shown. Ends of lower transformer core section 54 are placed in leg 41 and leg 42 of lower housing 12. A cap 14 is inserted into lower housing 12 and holds transformer part 22 in place so that when energy monitoring current transformer 10 is fully assembled, ends of lower transformer core section 54 come into contact with ends of upper transformer core section 21. As illustrated by FIG. 7, when assembled a wire guide 61 guides wire 53 out of an opening 63 and a wire guide 62 guides wire 52 out of an opening 64, allowing for a lead pull strength of 20 pounds for 1 minute. Opening 63 and opening 64 of cap 14 are shown in FIG. 6.

Placing wire guides 61 and 62 in cap 14 reduces or eliminates strain on the outer side wall of lower housing 12. This reduces the risk for deformation or damage to lower housing 12 under the maximum loading.

Table 8.2 of UL 2808, shown in FIG. 14, sets out electrical creepage resistance requirements. The requirements include minimal dimensional spacing for the distance from the surface of the enclosure for energy monitoring current transformer 10 and any of upper transformer core section 21, lower transformer core section 54, any other dead metal part, transformer coil 51 and any exposed conductor ends or other live components.

Spacing requirements are met when every potential creepage path that exists between gaps in the plastic enclosure for energy monitoring current transformer 10 is shorter that specified minimal length requirements in table 8.2 of UL 2808. The enclosure for energy monitoring current transformer 10 is designed to exceed the minimal length requirements.

Figure 8:
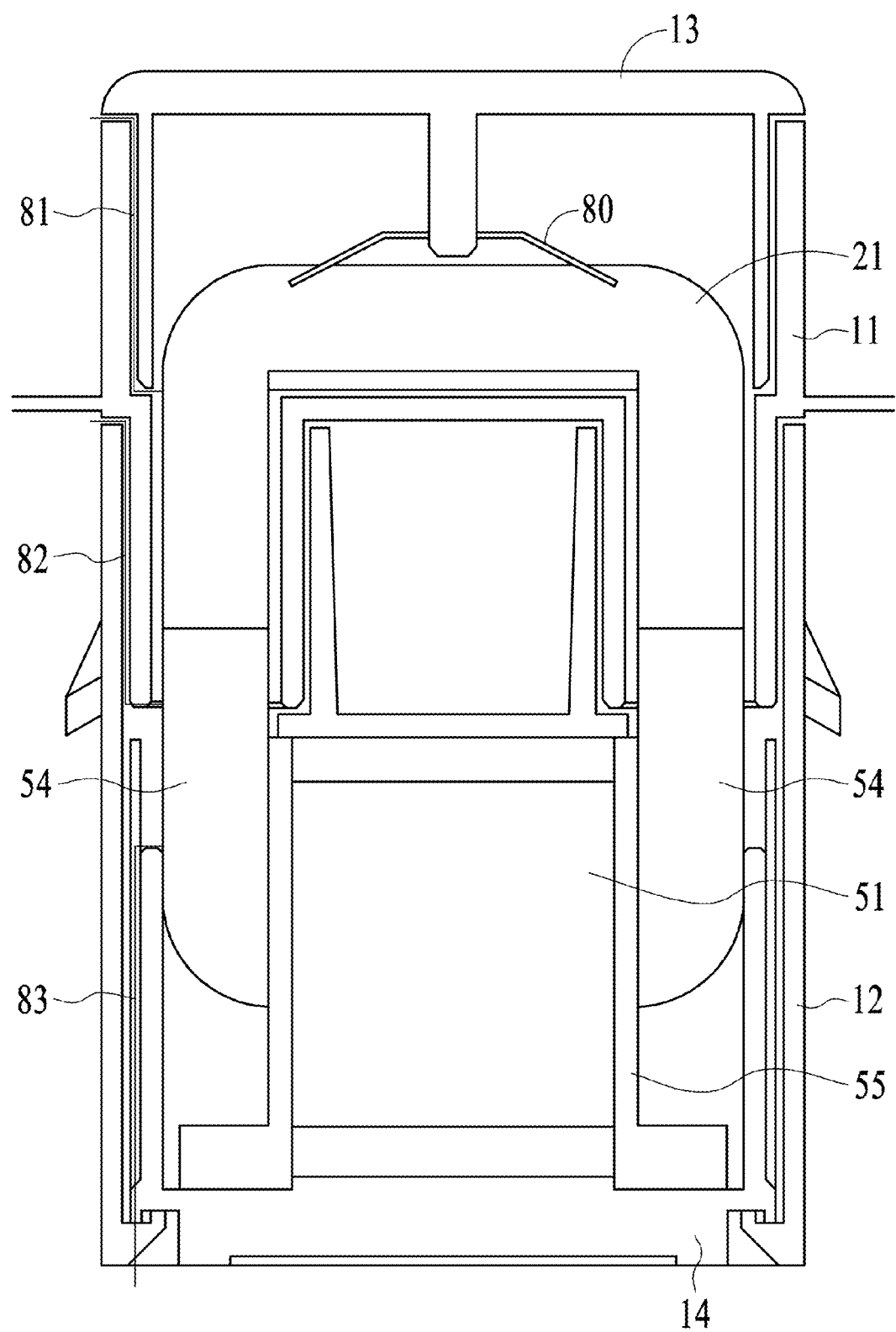
FIG. 8, FIG. 9 and FIG. 10 illustrate creepage paths for an energy monitoring current transformer in accordance with an implementation.

FIG. 8 illustrates creepage paths that exist in the enclosure for energy monitoring current transformer 10. A creepage path 81 extends from upper transformer core section 21 and through the gap between upper housing 11 and cap 13. A creepage path 82 extends from lower transformer core section 54 and through the gap between upper housing 11 and lower housing 12, as shown. A creepage path 83 extends from lower transformer core section 54 and through the gap between lower housing 12 and cap 14, as shown. Also shown in FIG. 8 is a spring 80 that is part of cap 13. Spring 80 pushes down on upper transformer core section 21, assuring there is a good connection between upper transformer core section 21 and lower transformer core section 54.

FIG. 8 illustrates creepage paths that exist from the transformer core to the external surface of the enclosure for energy monitoring current transformer 10. A creepage path 81 extends from upper transformer core section 21 and through the gap between upper housing 11 and cap 13, as shown. A creepage path 82 extends from lower transformer core section 54 and through the gap between upper housing 11 and lower housing 12, as shown. A creepage path 83 extends from lower transformer core section 54 and through the gap between lower housing 12 and cap 14, as shown. The amount of overlap between upper housing 11 and cap 13, the amount of overlap between upper housing 11 and lower housing, and the amount of overlap between lower housing 12 and cap 14 significantly increases the length of the resulting creepage paths.

Also shown in FIG. 8 is a spring 80 that is part of cap 13. Spring 80 pushes down on upper transformer core section 21, assuring there is a good connection between upper transformer core section 21 and lower transformer core section 54.

Figure 9:
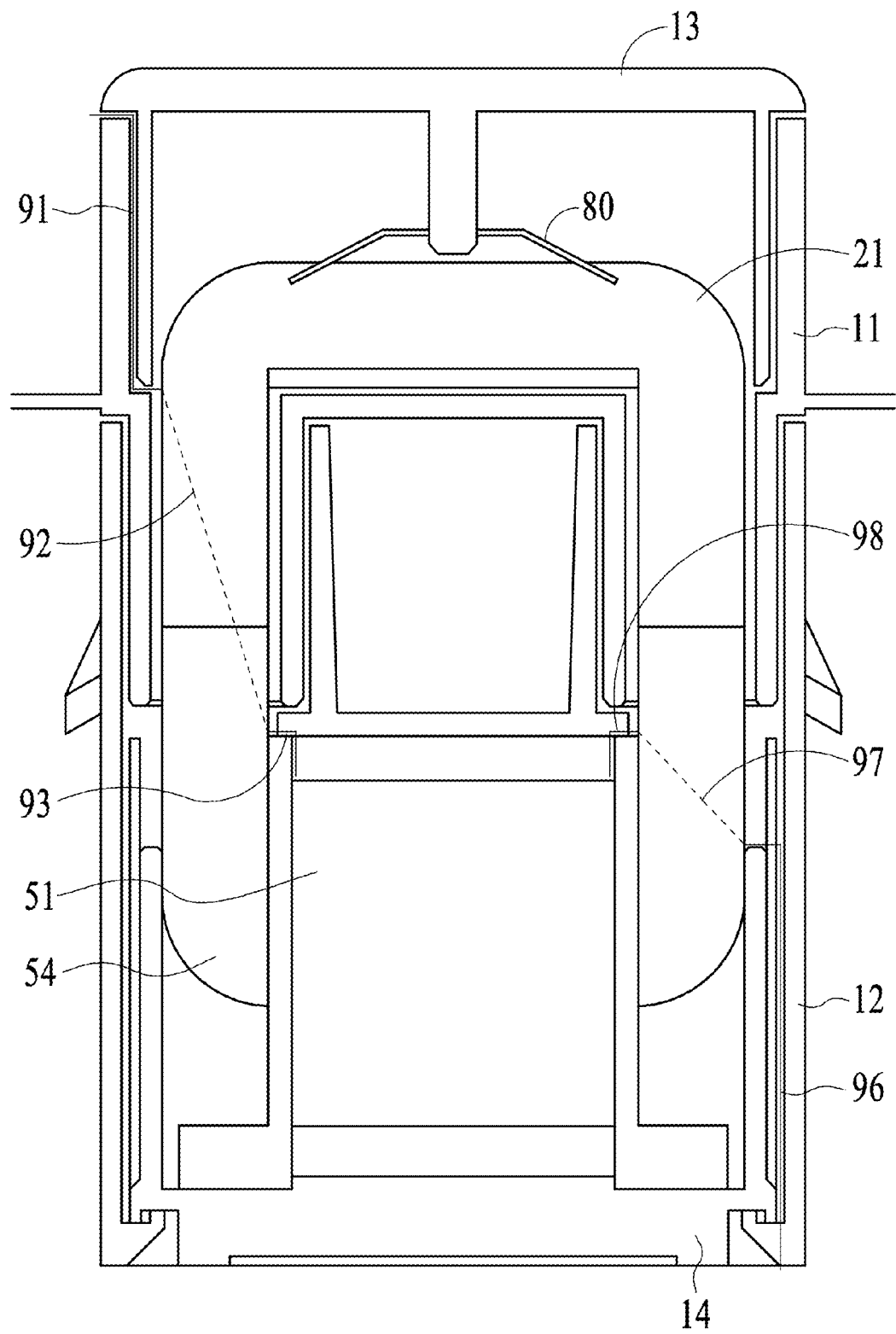

FIG. 9 illustrates creepage paths that exist from transformer coil 51 through the transformer core to the external surface of the enclosure for energy monitoring current transformer 10. A first creepage path 91 includes a first section 93 from transformer coil 51 to lower transformer core section 54 and a second section 91 from upper transformer core section 21 to the external surface of the enclosure for energy monitoring current transformer 10. Section 92 through lower transformer core section 54 and upper transformer core section 21 is not counted as part of the path length of the creepage path. A second creepage path 95 includes a first section 98 from transformer coil 51 to lower transformer core section 54 and a second section 96 from lower transformer core section 54 to the external surface of the enclosure for energy monitoring current transformer 10. Section 96 through lower transformer core section 54 is not counted as part of the path length of the creepage path.

Figure 10:
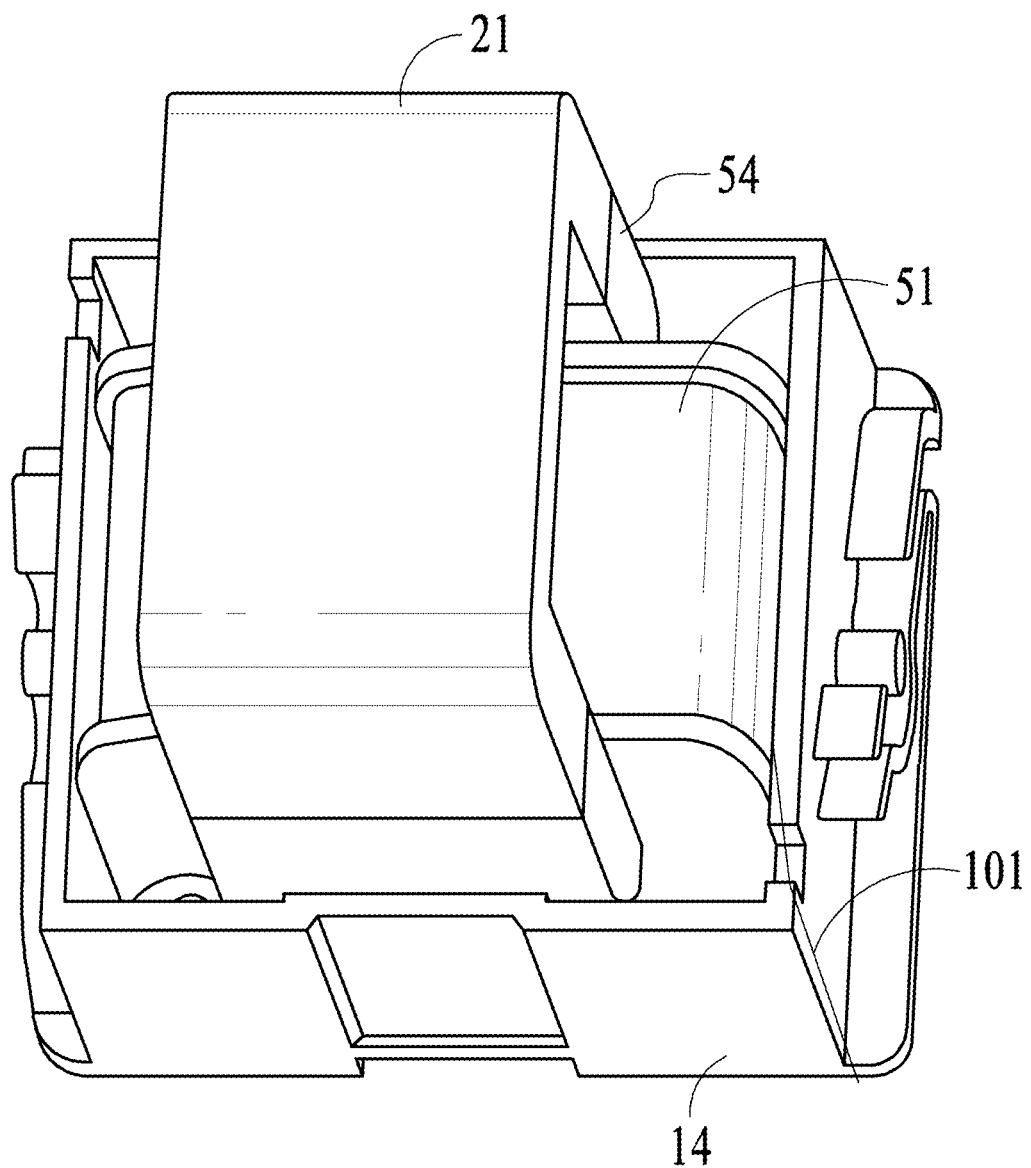

FIG. 10 illustrates a direct creepage path 101 from transformer coil 51 directly to the exterior to the external surface of the enclosure for energy monitoring current transformer 10.

Figure 11:
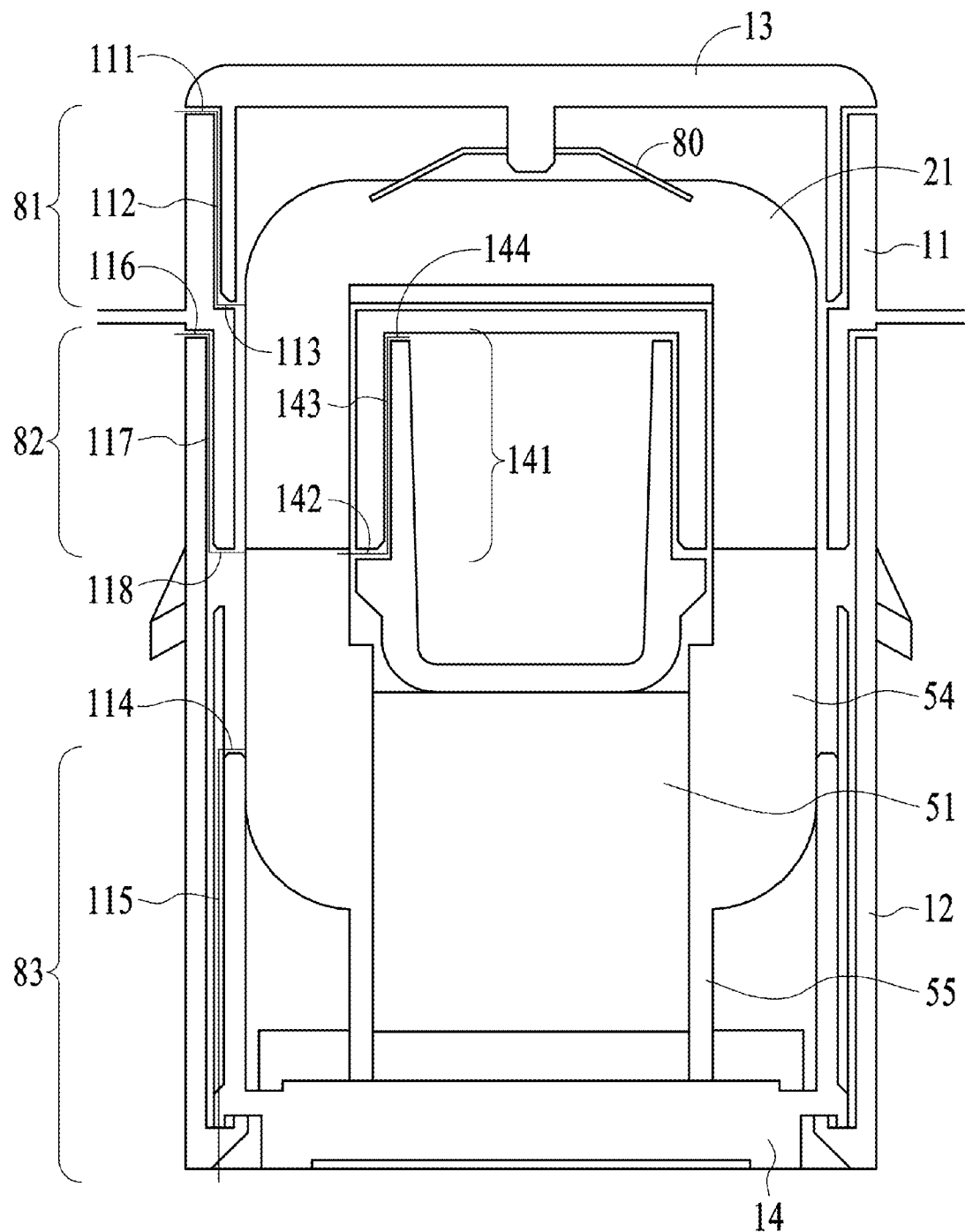
FIG. 11, FIG. 12 and FIG. 13 illustrate measurement of creepage paths for an energy monitoring current transformer in accordance with an implementation.

FIG. 11 illustrates calculation of creepage paths lengths measure from the transformer core. Creepage path 81 shown in FIG. 11 has a path length of 11 millimeters (mm), which is a sum of a one mm section 113, a nine mm section 112 and a one mm section 112. Section 112 represents the overlap between upper housing 11 and cap 13. While in FIG. 11, the overlap is shown to be nine mm, the overlap is for example, any length over seven mm.

Creepage path 82 has a path length of thirteen mm, which is a sum of a two mm section 118, a ten mm section 117 and a one mm section 116. Section 117 represents the overlap between upper housing 11 and lower housing 12. While in FIG. 11, the overlap is shown to be ten mm, the overlap is for example, any length over eight mm.

Creepage path 83 has a path length of eighteen mm, which is a sum of a one mm section 114 and a seventeen mm section 115. Section 115 represents the overlap between lower housing 12 and cap 14. While in FIG. 11, the overlap is shown to be seventeen mm, the overlap is for example, any length over twelve mm.

A creepage path 141 has a path length of thirteen mm, which is a sum of a two mm section 142, a ten mm section 143 and a one mm section 144.

Figure 12:
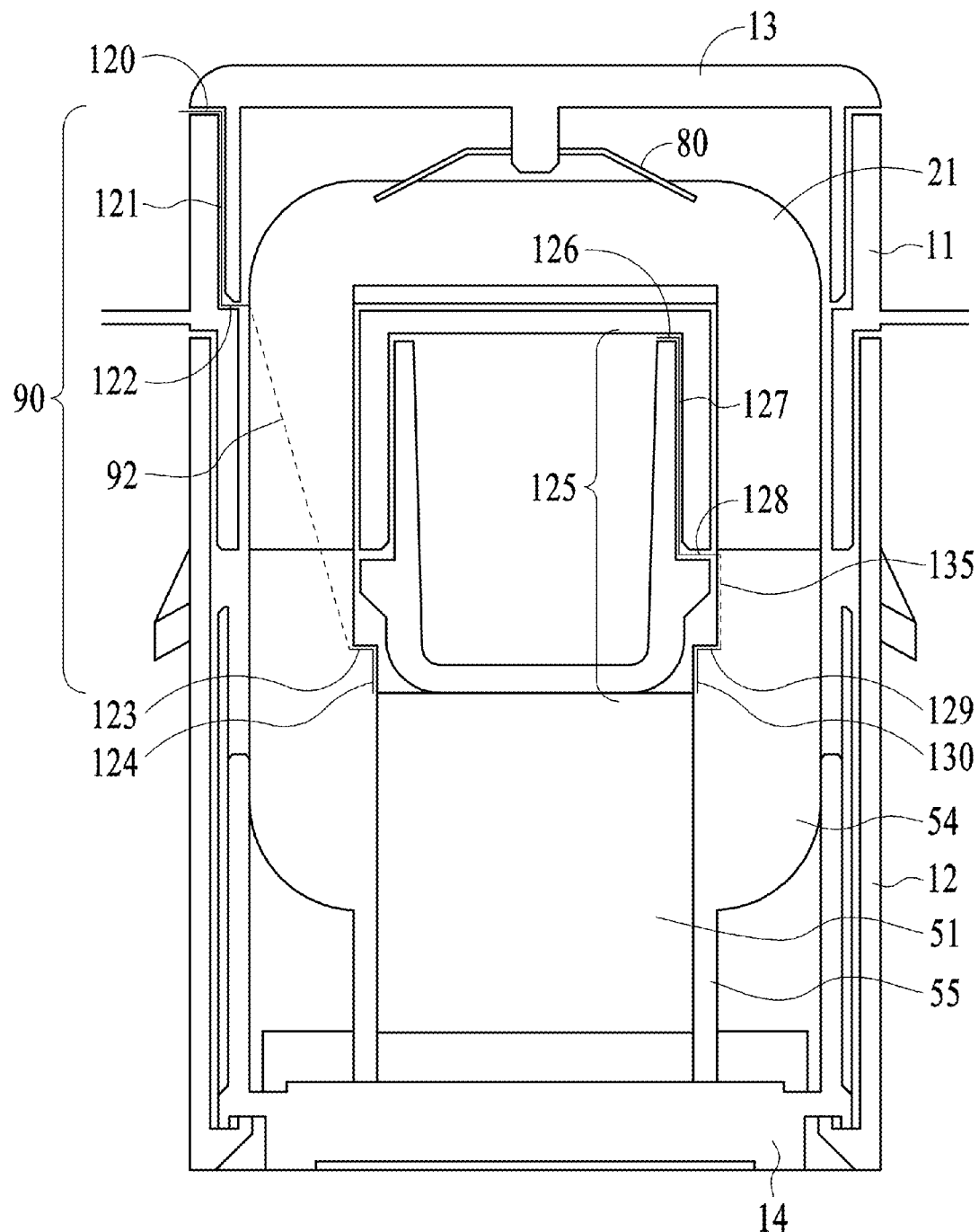

FIG. 12 illustrates calculation of creepage paths lengths measure from transformer coil through the transformer core to the external surface of the enclosure for energy monitoring current transformer 10. Creepage path 90 shown in FIG. 12 has a path length of eighteen millimeters (mm), which is a sum of a two mm section 124, a one mm section 123, a one mm section 122, a nine mm section 121 and a one mm section 120. Section 92 through lower transformer core section 54 and upper transformer core section 21 is not counted as part of the path length of the creepage path. A creepage path 125 has a path length of sixteen mm, which is a sum of a two mm section 130, a one mm section 129, a two mm section 128, a ten mm section 127 and a one mm section 126. A Section 135 along lower transformer core section 54 is not counted as part of the path length of the creepage path.

Figure 13:
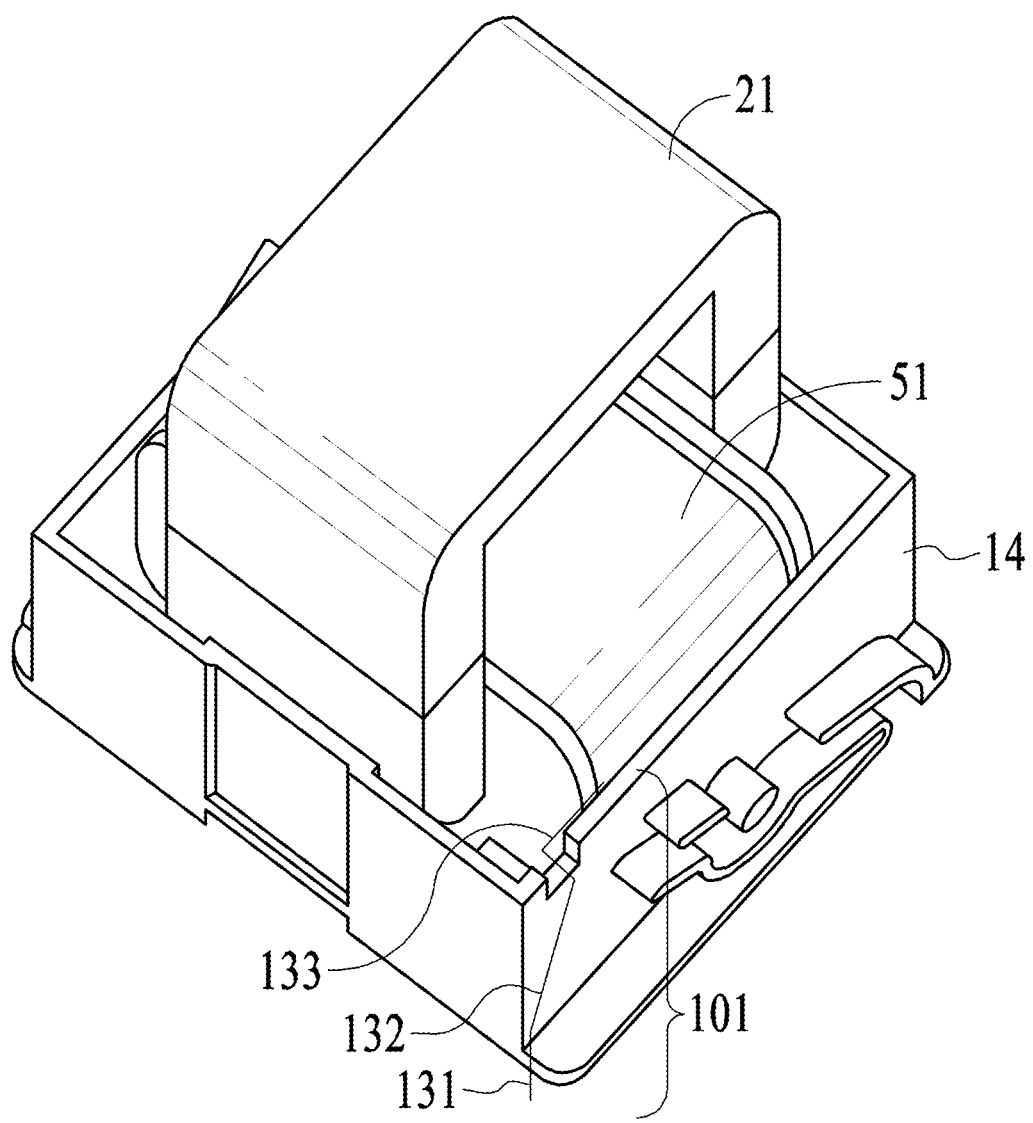

FIG. 13 illustrates calculation of creepage path length measured from transformer coil directly to the external surface of the enclosure for energy monitoring current transformer 10. Creepage path 101 has a path length of twenty-one mm, which is a sum of a four mm section 133, a fifteen mm section 132 and a two mm section 131.

The foregoing discussion discloses and describes merely exemplary methods and embodiments. As will be understood by those familiar with the art, the disclosed subject matter may be embodied in other specific forms without departing from the spirit or characteristics thereof. Accordingly, the present disclosure is intended to be illustrative, but not limiting, of the scope of the invention, which is set forth in the following claims.

What is claimed is:

1. An enclosure for an energy monitoring current transformer, the enclosure comprising:
   upper housing that houses an upper transformer core section;
   lower housing that houses a transformer coil, wherein when the enclosure is assembled there is an overlap between the upper housing and the lower housing of at least 8 millimeters;
   a cap for the upper housing, wherein when the enclosure is assembled there is an overlap between the cap for the upper housing and the upper housing of at least 7 millimeters; and,
   a cap for the lower housing, wherein when the enclosure is assembled there is an overlap between the cap for the lower housing and the lower housing of at least 12 millimeters;
   wherein the cap for the lower housing includes wire guides that guides lead wires from the transformer coil through the overlap between the cap for the lower housing and out holes in the lower housing.

2. An enclosure as in claim 1 wherein the enclosure is made of plastic.

3. An enclosure for an energy monitoring current transformer, the enclosure comprising:
   upper housing that houses an upper transformer core section;
   lower housing that houses a transformer coil; and,
   a cap for the lower housing, wherein when the enclosure is assembled there is an overlap between the cap for the lower housing and the lower housing of at least 12 millimeters, the cap for the lower housing includes wire guides that guides lead wires from the transformer coil through the overlap between the cap for the lower housing and out holes in the lower housing.

4. An enclosure as in claim 3 wherein the enclosure is made of plastic.

5. An enclosure as in claim 4, additionally comprising:
   a cap for the upper housing, wherein when the enclosure is assembled there is an overlap between the cap for the upper housing and the upper housing of at least 7 millimeters.

6. An enclosure as in claim 4, wherein when the enclosure is assembled there is an overlap between the upper housing and the lower housing of at least 8 millimeters.

7. An enclosure for an energy monitoring current transformer, the enclosure comprising:
   upper housing that houses an upper transformer core section;
   lower housing that houses a transformer coil and a lower transformer core section, wherein when the enclosure is assembled there is an overlap between the upper housing and the lower housing that lengthens a creepage path from the lower transformer core to an external surface of the enclosure;
   a cap for the upper housing, wherein when the enclosure is assembled there is an overlap between the cap for the upper housing and the upper housing that lengthens a creepage path from the upper transformer core to the external surface of the enclosure; and,
   a cap for the lower housing, wherein when the enclosure is assembled there is an overlap between the cap for the lower housing and the lower housing that lengthens a creepage path from the upper transformer core to the external surface of the enclosure;
   wherein the cap for the lower housing includes wire guides that guides lead wires from the transformer coil through the overlap between the cap for the lower housing and out holes in the lower housing.

8. An enclosure as in claim 7 wherein the enclosure is made of plastic.

\* \* \* \* \*